United States Patent [19]

Hwang

[11] Patent Number: 5,512,519
[45] Date of Patent: Apr. 30, 1996

[54] METHOD OF FORMING A SILICON INSULATING LAYER IN A SEMICONDUCTOR DEVICE

[75] Inventor: Hyunsang Hwang, Seoul, Rep. of Korea

[73] Assignee: Goldstar Electron Co., Ltd., Cheongju, Rep. of Korea

[21] Appl. No.: 376,716

[22] Filed: Jan. 23, 1995

[30] Foreign Application Priority Data

Jan. 22, 1994 [KR] Rep. of Korea .................. 94-1148

[51] Int. Cl.$^6$ ................................. H01L 21/265
[52] U.S. Cl. ............................ 437/242; 437/239
[58] Field of Search ....................... 437/239, 242

[56] References Cited

U.S. PATENT DOCUMENTS 5,244,843  9/1993  Chau ........................ 437/239
5,397,720  3/1995  Kwong ..................... 437/242

FOREIGN PATENT DOCUMENTS 0284107  9/1988  European Pat. Off. .

OTHER PUBLICATIONS

Hyunsang Hwang, et al.; "Electrical and Reliability Characteristics of Ultrathin Oxynitride Gate Dielectric Prepared by Rapid Thermal Processing in $N_2O$"; 1990 IEEE; pp. 421–424.

Hyunsang Hwang, et al.; "Electrical characteristics of ultrathin oxynitride gate dielectric prepared by rapid thermal oxidation of Si in $N_2O$"; 1990 American Institute of Physics; Sep. 1990; pp. 1010–1011.

Philip J. Tobin, et al.; "Silicon Oxynitride Formation in Nitrous Oxide ($N_2O$): The Role of Nitric Oxide (No)"; 4b–5; pp. 51–52.

*Primary Examiner*—Sam Silverberg
*Attorney, Agent, or Firm*—Alan R. Loudermilk

[57] ABSTRACT

The present invention provides a method of forming an insulating layer of a semiconductor device, in which an oxide layer having an optimum nitrogen concentration and also a sufficient thickness may be grown by independently regulating the flow rate of NO and $O_2$ gas and supplying the NO and $O_2$ gas to a reaction chamber. This method is such that the NO and $O_2$ gas is supplied to the chamber by regulating the NO and $O_2$ gas, while maintaining the inside of the chamber at a temperature of about 750° C. to 1050° C. for a predetermined time, wherein nitrogen is included in a Si/SiO$_2$ interface.

18 Claims, 1 Drawing Sheet

METHOD OF FORMING A SILICON INSULATING LAYER IN A SEMICONDUCTOR DEVICE

FIELD OF THE INVENTION

The present invention relates generally to methods of forming silicon insulating layers in semiconductor devices, and more particularly to a method of forming a silicon insulating layer in a semiconductor device in which an oxide layer is formed by regulating the flow rate of NO and $O_2$ gas instead of an $O_2$ gas in a reaction chamber, so that nitrogen may penetrate into an Si and $SiO_2$ interface in order to improve the reliability of the semiconductor device.

BACKGROUND OF THE INVENTION

In an MOS transistor, a gate electrode is formed on an insulating layer between a source and drain region. A channel region is located between the source and drain region. A silicon oxide layer typically is used as the insulating layer between the gate electrode and the channel region.

Conventionally, the oxide layer is formed by oxidizing silicon under an $O_2$ atmosphere. However, according to recent literature such as Hyunsang HWANG et al., Appl. Phys. Lett. Vol. 57. pp. 1010–1990 and Hyunsang HWANG et al., IEEE IEDM '90 p. 421, it is reported that, in the case of growing a gate oxide layer under an $N_2O$ atmosphere, a certain amount of nitrogen may permeate into the $Si/SiO_2$ interface. Thus, characteristics of the semiconductor device, such as a device including a MOSFET, may be improved. Boron also may penetrate into the gate oxide and the channel region in the case of using a P+ polysilicon gate electrode.

It could be said that the reliability of the semiconductor device improves by growing the gate oxide layer under an $N_2O$ atmosphere, because the nitrogen partially eases the strain in the $Si/SiO_2$ interface, so that generation of traps in the interface due to electrical stress possibly may be reduced.

By using an $N_2O$ atmosphere instead of an $O_2$ atmosphere in the oxidation process, the nitrogen simply may be included into the Si surface. However, since this reaction process needs a very high reaction temperature, in the case of utilizing a conventional process temperature, the thickness of the oxide layer formed becomes very thin and the nitrogen contained therein is relatively small in quantity.

According to a recent article, P. J. Tobin, Symp. on VLSI technology, 1993. P. 51, the $N_2O$ is resolved into $N_2$ of 64.3%, $O_2$ of 31% and NO of 4.7% at a temperature of 950° C. This article illustrates that the amount of nitrogen is directly related to that of NO. Thus, it is necessary that the amount of NO be increased so that the optimum nitrogen may penetrate more rapidly into the $Si/SiO_2$ interface.

With known techniques, since resolution of $N_2O$ occurs at a very high temperature, it takes a long time to react $N_2O$ at a low temperature, and nitrogen obtained therefrom is of little quantity. If the value of the "temperature"×"time" becomes great, a junction forms deeply, and it is difficult for the resulting structure to be practically used in a new generation element. Since $N_2$ reacts at the temperature of about 1050° C., a reaction process should be carried out in a rapid thermal process. Thus, it is difficult to obtain a semiconductor device with good reliability and efficiency.

SUMMARY OF THE INVENTION

An object of the present invention is to provide a method of forming a silicon insulating layer in a semiconductor device, wherein, on the basis of the fact that $N_2O$ decomposes into $N_2$, $O_2$ and NO at a high temperature, an oxide layer having an optimum amount of nitrogen and also a sufficient thickness can be grown by independently regulating the flow rate of NO and $O_2$ gas and supplying the NO and $O_2$ gas to a reaction vessel.

The present invention makes it possible to form the insulating layer at a considerably lower temperature by using NO and $O_2$ gas with good reaction characteristics, as opposed to conventional methods using an $N_2O$ gas requiring a high temperature. According to the method of the present invention, the thickness of a gate oxide layer may be easily regulated by growing the oxide layer under a high NO density atmosphere after oxidation under a low NO density, while in the case of the conventional method the oxide layer, with nitrogen is contained in a surface, would become considerably thin.

BRIEF DESCRIPTION OF THE DRAWINGS

The above objects and other advantages of the present invention will become more apparent by describing preferred embodiments of the present invention with reference to the attached drawings, in which.

DETAILED DESCRIPTION OF THE PRESENT INVENTION

Figure 1:
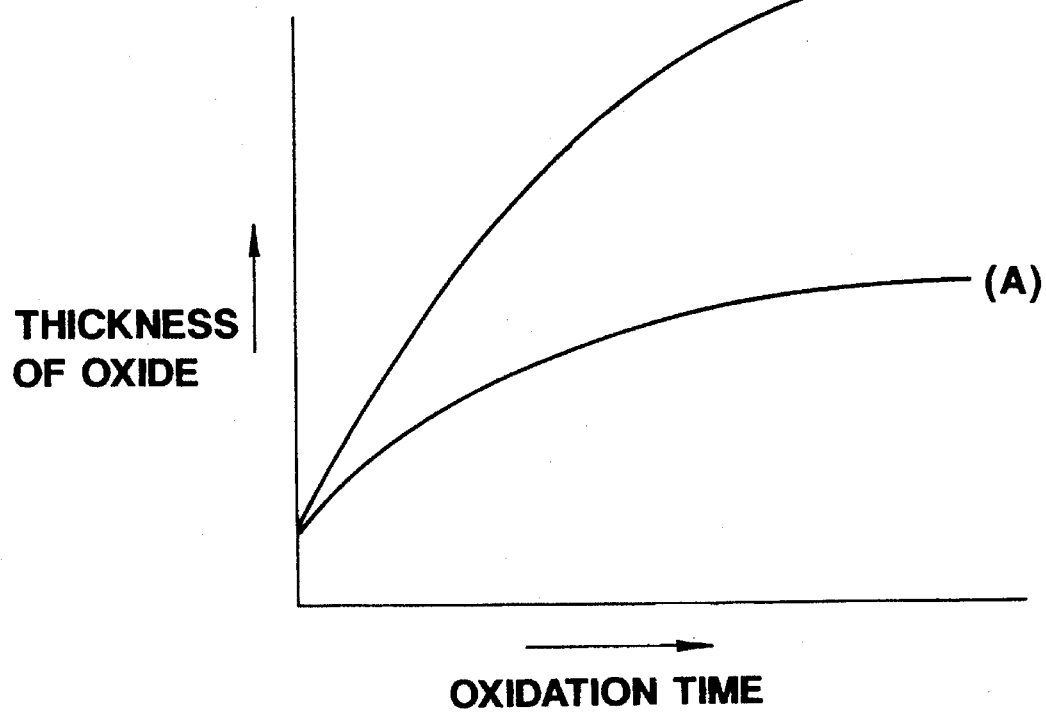
FIG. 1 is a graph illustrating the thickness of a grown oxide layer according to oxidation time.

A method for forming an insulating layer in a semiconductor device according to the present invention may include the following steps as described herein.

Initially, a preparation step is carried out. That is, after locating a semiconductor wafer in a reaction chamber of a CVD (Chemical Vapor Deposition) apparatus in order to form a gate insulating layer thereon, the chamber is purged with nitrogen or argon gas at atmospheric pressure while maintaining a temperature of about 750° C. to 1050° C.

Next, an oxidation process is performed by supplying NO and $O_2$ gas thereto. At this time, the flow rate of the NO and $O_2$ gas which flows into the chamber is regulated according to the desired thickness and purpose of the oxide layer. Generally, the flow rate of the NO and $O_2$ gas is preferably from 100 to 1 to 1 to 100.

To obtain a gate oxide layer with a thickness of about 100 Å, the oxidation process is performed at a temperature of about 900° C for about 20 to 30 minutes.

To obtain a thicker oxide layer, the flow rate is regulated to flow the $O_2$ gas at a higher rate. In order to increase the amount of nitrogen included in the oxide layer, the flow rate of the NO gas is regulated to flow at a higher rate.

To increase the number of nitrogen atoms included in the $Si/SiO_2$ interface, the flow rate of the $O_2$ gas is highly regulated at the beginning of the oxidation process, and then the flow rate of the NO gas is highly regulated at the end of the oxidation process. Thus, a relatively thick oxide layer is grown at a low temperature with a high flow rate of $O_2$, so that a desired amount of nitrogen can be included therein with a high flow rate of NO.

To increase the nitrogen amount contained in the interface, the oxide layer that is formed is treated with heat at a somewhat higher temperature by regulating highly the flow rate of the NO gas after the oxidation process.

The process described above is applicable not only to a method of forming a silicon insulating layer in a MOSFET. If this process is applied to the manufacture of a tunnelling oxide layer for non-active elements such as in EPROM, EEPROM and flash memory, a good effect on characteristics can be achieved.

It is not necessary herein to explain widely known techniques for manufacturing EPROM, EEPROM and flash memory devices. However, an insulating layer in such devices can be formed by the method of the present invention instead of a conventional method in a formation step of a gate oxide or a tunnelling oxide.

An effect that an insulating layer formed by the present invention may have on the characteristics of an element in a device is similar to that disclosed in the literature mentioned previously. Reliability of the element can be improved, and boron is prevented from passing into a P+ gate of a PMOSFET. Also, the production rate of the devices may be improved.

Advantages of the present invention that are superior to the method mentioned in the above literature include a lowering of the growing temperature of the oxide layer, the easy regulation of the thickness of the oxide layer, and providing a desirable amount of nitrogen according to the desired characteristics of each element. In the conventional process, the process temperature is only a variable, while in the present invention, since the temperature, the type of gas and the flow rate of the gas are variables, an optimum process may be advantageously performed.

FIG. 1 is a graph illustrating the growth thickness of an oxide layer according to the oxidation time. As illustrated in FIG. 1, when the oxidation process is performed under a temperature of 950° C., curved line A indicates a relation by the conventional method where the oxidation process is performed under only an $N_2O$ atmosphere so that the oxide layer is relatively slowly grown, but curved line B indicates a relation by the present method where the oxidation process is performed under an NO and $O_2$ atmosphere so that the oxide layer is rapidly grown.

Figure 2:
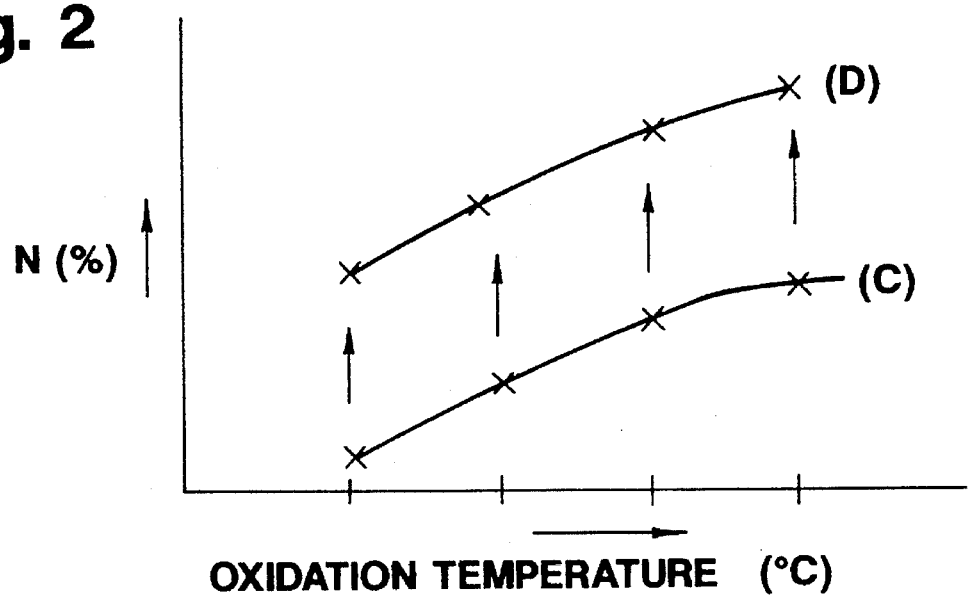
FIG. 2 is a graph illustrating a nitrogen density relationship among process temperature, silicon substrate and silicon oxide.

FIG. 2 is a graph illustrating a nitrogen density relationship among process temperature, silicon substrate and silicon oxide. As illustrated in FIG. 2, curved line C indicates the conventional technique where the oxidation process is performed under only an $N_2O$ atmosphere to illustrate a low nitrogen-containing rate, but curved line D indicates the present invention where the oxidation process is performed under an NO and $O_2$ atmosphere to illustrate an extremely high nitrogen containing rate.

The present invention is used in the manufacturing process of the MOSFET having a silicon insulating layer. But, this invention is of wide application to all products including devices such as MOSFETs or other devices with insulating layers. In particular, the present invention is applicable to the tunnelling oxide layer of the non-active elements such as in EPROM, EEPROM and flash memory to remarkably lengthen the life time of these elements.

The present invention has been described with respect to several embodiments for the purpose of clarity and simplicity. One of ordinary skill in the art will appreciate that variations and/or modifications to concepts explained above will still fall within the scope of the invention as claimed in the appended claims.

What is claimed is:

1. A method of forming an insulating layer in a semiconductor device, comprising the steps of:

positioning a silicon wafer in a reaction chamber of a CVD apparatus, purging the reaction chamber, and maintaining a reaction chamber temperature of about 750° C. to 1050° C.;

carrying out an oxidation process on the silicon wafer by supplying a gas containing essentially NO and an $O_2$-containing gas to the reaction chamber and independently regulating the flow rate of the NO- and $O_2$-containing gases, while maintaining the reaction chamber temperature to about 750° C. to 1050° C. for a predetermined time, wherein the insulating layer including nitrogen in a $Si/SiO_2$ interface is formed.

2. The method of claim 1, wherein the oxidation process is performed by maintaining a constant flow rate of the NO- and $O_2$- containing gases.

3. The method of claim 1, wherein the flow rate of the $O_2$-containing gas is regulated to a high flow rate at the beginning of the oxidation process, and the flow rate of the NO-containing gas is regulated to a high flow rate at the end of the oxidation process.

4. The method of claim 1, wherein the oxide layer is annealed at a temperature higher than that of the oxidation process by regulating the flow rate of the NO-containing gas to a high flow rate after the oxidation process, wherein more nitrogen is included in the $Si/SiO_2$ interface.

5. The method of claim 1, wherein the oxidation process is performed at a temperature of about 900° C. for about 20 to 30 minutes with a constant flow rate of the NO- and $O_2$-containing gases, wherein an insulating layer with a thickness of about 100 Å is formed.

6. The method of claim 1, wherein the oxidation process is performed at a temperature of about 900° C. for about 20 to 30 minutes, wherein the flow rate of the $O_2$ containing gas is regulated to be higher at the beginning of the oxidation process and the flow rate of the NO-containing gas is regulated to be higher at the end of the oxidation process, wherein an insulating layer with a thickness of about 100 Å is formed.

7. The method of in claim 1, wherein the oxidation process is performed at the temperature of about 900° C. for about 20 to 30 minutes with a regulated flow rate of the NO- and $O_2$-containing gases, wherein an insulating layer with the thickness of about 100 Å is formed, and wherein the oxide layer is annealed at a temperature above about 900° C. under an NO only atmosphere, wherein more nitrogen is included into the $Si/SiO_2$ interface.

8. The method of claim 1, wherein the insulating layer serves as a gate insulating layer of an MOS transistor.

9. The method of claim 1, wherein the insulating layer serves as a tunnelling insulating layer of an EPROM cell.

10. The method of claim 1, wherein the insulating layer serves as a tunnelling layer of an EEPROM cell.

11. The method claim 1, wherein the insulating layer serves as a tunnelling insulating of a flash memory.

12. A method of forming an insulating layer on a silicon surface comprising the steps of:

supplying and exposing the silicon surface to an $O_2$-containing gas to form an oxide layer on the silicon surface; and supplying and exposing the silicon surface and the oxide layer to a gas containing essentially NO, wherein nitrogen is introduced into the interface of the oxide layer and the silicon surface, wherein the temperature is maintained in a range of about 750° C. to 1050° C., and the supply of the NO- and $O_2$-containing gases is regulated independently.

13. The method of claim 12, wherein the silicon surface is exposed to an NO-containing gas.

14. The method of claim 13, wherein the flow rates of the NO- and $O_2$ containing gases are maintained at a substantially constant level.

15. The method of claim 12, wherein the silicon surface is exposed to an $O_2$-containing gas at a first temperature, and wherein the silicon surface having an oxide layer is exposed to an NO-containing gas at a second temperature, wherein the first temperature is lower than the second temperature.

16. The method of claim 15 wherein the $O_2$ concentration of the $O_2$-containing gas and the first temperature are controlled to form an oxide layer of a desired thickness, and wherein the NO concentration of the NO-containing gas and the second temperature are controlled to introduce a desired amount of nitrogen into the interface between the oxide layer and the silicon surface.

17. The method of claim 12, wherein the silicon surface is exposed to $O_2$ of a concentration and at a temperature optimized to form the oxide layer, and wherein the oxide layer on the silicon surface is exposed to NO of a concentration and a temperature optimized to introduce nitrogen into the interface between the oxide layer and the silicon surface.

18. The method of claim 17, wherein the oxide layer is formed as part of an MOS transistor forming process, an EPROM cell forming process, an EEPROM forming process, or a flash memory forming process.

* * * * *